United States Patent
Krajcevski et al.

(10) Patent No.: US 10,244,250 B2
(45) Date of Patent: Mar. 26, 2019

(54) VARIABLE-RATE TEXTURE COMPRESSION USING FIXED-RATE CODES

(71) Applicant: Samsung Electronics Co., Ltd., Suwon-si, Gyeonggi-do (KR)

(72) Inventors: Pavel Krajcevski, Carrboro, NC (US); Karthik Ramani, San Jose, CA (US); Abhinav Golas, Mountain View, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/098,066

(22) Filed: Apr. 13, 2016

(65) Prior Publication Data

US 2016/0353122 A1 Dec. 1, 2016

Related U.S. Application Data

(60) Provisional application No. 62/168,594, filed on May 29, 2015, provisional application No. 62/233,203, filed on Sep. 25, 2015.

(51) Int. Cl.
*H04N 19/46* (2014.01)
*H04N 19/176* (2014.01)
*H04N 19/119* (2014.01)
*H04N 19/154* (2014.01)
*H04N 19/162* (2014.01)
*H03M 7/30* (2006.01)

(52) U.S. Cl.
CPC .......... *H04N 19/46* (2014.11); *H03M 7/3084* (2013.01); *H04N 19/119* (2014.11); *H04N 19/154* (2014.11); *H04N 19/162* (2014.11); *H04N 19/176* (2014.11)

(58) Field of Classification Search
None
See application file for complete search history.

(56) References Cited

U.S. PATENT DOCUMENTS

| | | | | |
|---|---|---|---|---|
| 5,892,517 A * | 4/1999 | Rich | ........................ | G06T 1/60 345/582 |
| 5,956,431 A * | 9/1999 | Iourcha | ..................... | G06T 9/00 382/253 |
| 6,141,446 A * | 10/2000 | Boliek | .................... | H03M 7/30 375/240.11 |
| 6,381,364 B1 * | 4/2002 | Gardos | ..................... | G06T 9/40 382/173 |

(Continued)

*Primary Examiner* — Tsung-Yin Tsai
(74) *Attorney, Agent, or Firm* — Lewis Roca Rothgerber Christie LLP

(57) ABSTRACT

A fixed rate compressor is used to perform variable rate texture compression. A texture image is accessed. A block size used to compress the image is automatically varied over the image to achieve variable rate texture compression. The block size may be selected to reduce the compressed texture image size and adapted in local regions of the texture image based on quality considerations, such as a quality condition that an error for each block be less that a threshold error. The restriction on block size and block types may be selected to perform decompression with hardware conventionally used to perform decompression of fixed-rate blocks. The quality condition may be user-selectable by a user input to provide additional control over the tradeoffs between quality and compression.

20 Claims, 11 Drawing Sheets

(56) References Cited

U.S. PATENT DOCUMENTS

| | | | |
|---|---|---|---|
| 6,501,862 B1* | 12/2002 | Fukuhara | G06T 9/001 382/233 |
| 6,658,146 B1* | 12/2003 | Iourcha | G06T 9/005 382/162 |
| 6,683,978 B1* | 1/2004 | Iourcha | G06T 9/005 382/166 |
| 6,956,667 B2 | 10/2005 | Delhoune et al. | |
| 7,139,437 B2 | 11/2006 | Jones et al. | |
| 8,019,938 B2 | 9/2011 | Flynn et al. | |
| 8,218,640 B2 | 7/2012 | Wang | |
| 8,266,496 B2 | 9/2012 | Flynn et al. | |
| 8,478,057 B1 | 7/2013 | Cui et al. | |
| 8,532,198 B2 | 9/2013 | Kumwilaisak et al. | |
| 8,861,875 B1 | 10/2014 | Doucette et al. | |
| 9,626,730 B2* | 4/2017 | Nystad | H04N 19/90 |
| 2003/0053706 A1* | 3/2003 | Hong | G06T 9/005 382/253 |
| 2004/0103215 A1 | 5/2004 | Ernst et al. | |
| 2006/0017741 A1* | 1/2006 | Sekine | G06T 15/04 345/582 |
| 2006/0018552 A1* | 1/2006 | Malayath | H04N 19/176 382/232 |
| 2007/0104378 A1 | 5/2007 | Aguera Y Arcas | |
| 2008/0055331 A1* | 3/2008 | Iourcha | G06T 9/00 345/582 |
| 2009/0150359 A1 | 6/2009 | Masuyama | |
| 2009/0202159 A1* | 8/2009 | Strom | G06T 9/001 382/232 |
| 2010/0328425 A1* | 12/2010 | Nagaraj | G06T 9/001 348/42 |
| 2011/0200264 A1* | 8/2011 | Park | H04N 19/139 382/236 |
| 2011/0235928 A1* | 9/2011 | Strom | H04N 19/176 382/233 |
| 2012/0137059 A1 | 5/2012 | Yang et al. | |
| 2012/0218292 A1 | 8/2012 | Nyczyk | |
| 2012/0281925 A1* | 11/2012 | Nystad | H04N 19/90 382/232 |
| 2012/0294365 A1* | 11/2012 | Zheng | H04N 19/176 375/240.16 |
| 2012/0320067 A1* | 12/2012 | Iourcha | G06T 9/00 345/501 |
| 2013/0084018 A1* | 4/2013 | Nystad | G06K 9/36 382/232 |
| 2013/0148740 A1 | 6/2013 | Samanta Singhar | |
| 2013/0182971 A1* | 7/2013 | Leontaris | G06T 5/002 382/275 |
| 2013/0293738 A1* | 11/2013 | Kulkarni | H04N 19/63 348/222.1 |
| 2014/0072242 A1 | 3/2014 | Wei et al. | |
| 2014/0177971 A1* | 6/2014 | Strom | H04N 19/46 382/232 |
| 2015/0091921 A1 | 4/2015 | Cote et al. | |
| 2015/0350655 A1* | 12/2015 | Huang | H04N 19/146 375/240.12 |
| 2015/0379684 A1* | 12/2015 | Ramani | G06T 1/60 345/531 |

\* cited by examiner

VARIABLE-RATE TEXTURE COMPRESSION USING FIXED-RATE CODES

CROSS REFERENCE TO RELATED APPLICATIONS

The present application claims the benefit of U.S. Provisional Application No. 62/168,594, filed on May 29, 2015 and U.S. Provisional Application No. 62/233,203, filed on Sep. 25, 2015; in which the contents of both are hereby incorporated by reference in their entirety.

FIELD OF THE INVENTION

An embodiment of the present invention is generally related to compression of textures using fixed rate codes to achieve variable rate compression. In one embodiment, variable rate codecs are implemented in hardware in a piecewise fixed rate.

BACKGROUND OF THE INVENTION

Texture compression has become a part of most graphics hardware implementations. Apart from providing benefits in terms of reduced memory bandwidth between the central processing unit (CPU) and graphical processing unit (GPU), compressed textures provide more efficient use of GPU memory and its bandwidth, and can allow for increased complexity in modern graphical scenes.

Many traditional texture compression formats are limited to performing one memory lookup per pixel. As memory access is one of the most energy inefficient operations in modern graphics processors, this restriction is necessary to preserve battery life, reduce access latency, and keep latency predictable for sustained performance.

A variety of texture compression approaches use a 'fixed-rate' approach to texture compression, i.e., each block of texels in a texture is compressed to the same number of bytes. As an example, the Adaptive Scalable Texture Compression (ASTC) is an algorithm that is an official extension of several graphics standards. For a given texture, a fixed block footprint with a single block size (e.g., 4×4 texels, 6×6 texels, 12×12 texels, etc) is selected to define a standard block size for the entire texture. For example, if a 12×12 footprint is selected, then all of the blocks of the texture are compressed as 12×12 blocks. The ASTC also specifies that a fixed number of bits are used regardless of the block size. Thus, the number of bits per texel depends on the block size selected for the texture.

Fixed-rate compression simplifies address calculation during the decompression phase, but leads to a wide variation in quality across the texture. In particular, choosing an aggressive compression scheme may lead to smoothing of important high-frequency features in the texture. This lack of flexibility leads to a quality vs. compression tradeoff, where an application designer chooses between the size of the compressed texture and the resulting quality.

DETAILED DESCRIPTION

Figure 1:
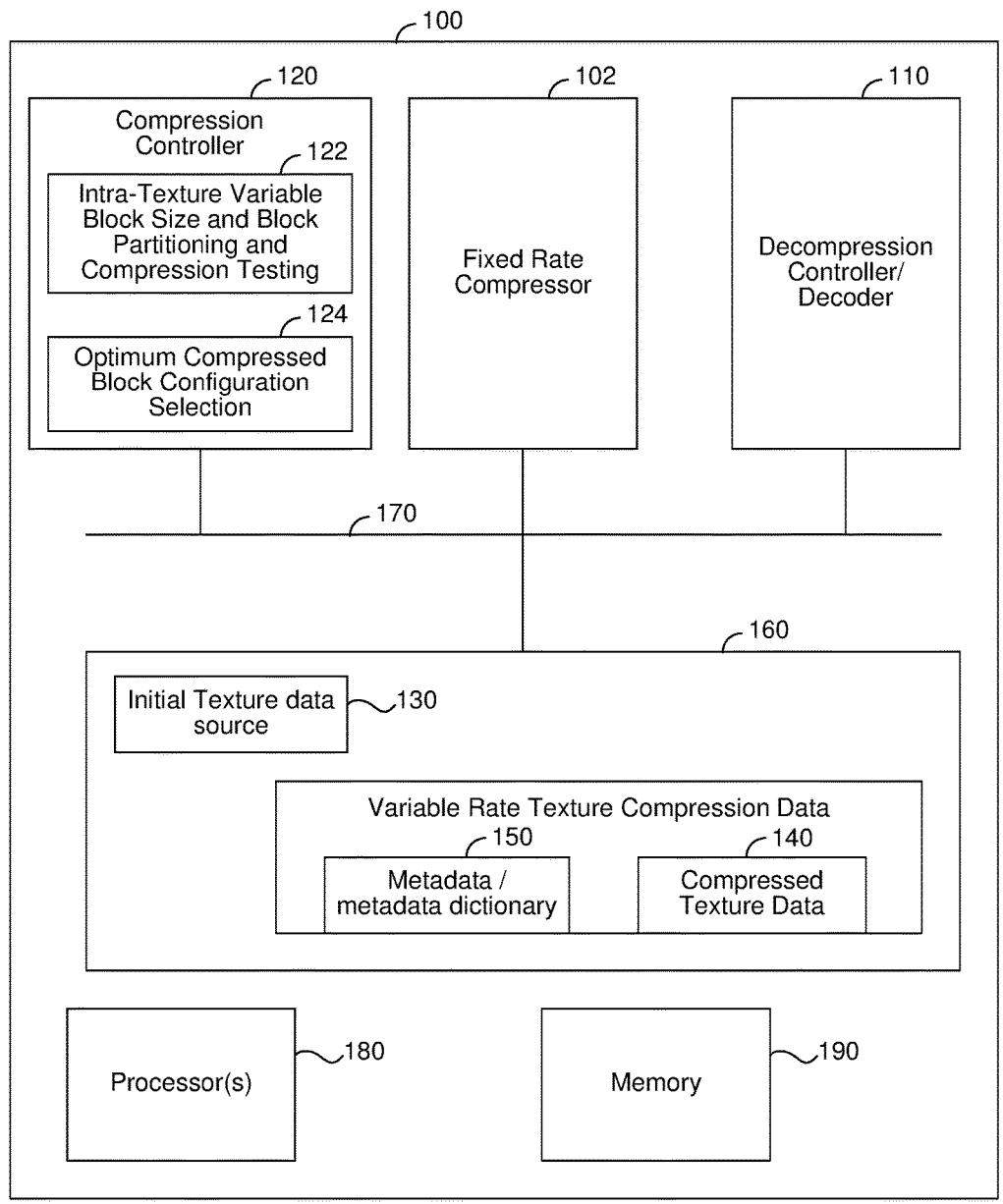
FIGS. 1 illustrates a variable rate compression and decompression system in accordance with an embodiment.

FIG. 1 is a block diagram of a system 100 in accordance with an embodiment. The system 100 includes at least one processor 180 and a memory 190. A fixed rate compressor 102 is provided to compress textures with a fixed number of bits per block, where there is further a range of allowed block sizes including at least two different allowed block sizes (block types).

In one embodiment, the underlying structure of compressed texture data includes two components—metadata and data. Texture data is partitioned into texel chunks of k×k pixel blocks, which are compressed and decompressed as single entities. Compressed blocks form the data in the underlying structure, while information about the size of compressed data and its address in memory forms the metadata. As a fixed number of bits are provided to compress the data of each block, the number of bits per texel is lower for larger blocks. An exemplary range of block sizes include a 4×4 block footprint, a 6×6 block footprint, an 8×8 block footprint, and a 12×12 block footprint, although more generally other block sizes may be used that are compatible with allowed sizes of the fixed rate compressor 102 to minimize additional hardware. The set of allowed block sizes may be selected to be compatible with allowed block sizes within industry formats used for fixed rate compression, such as the Adaptive Scalable Texture Compression (ASTC), to reduce additional hardware requirements.

A decompression controller/decoder 110 is provided to decompress compressed textures.

A compression controller 120 accesses initial texture data 130. In one embodiment the compression controller includes computer program instructions stored on a memory and executable by a process. In one embodiment, the compression controller 120 includes a module 122, which may be implemented as computer program instructions stored on a memory, to support testing different block sizes and block partitioning configurations, where a given configuration may include blocks of one of the allowed sizes or have blocks of two or more of the allowed sizes. Constrained optimization is performed to select block sizes that minimize overall compressed texture size while satisfying an error threshold test, consistent with a minimum compression quality, for each block of the compressed texture. The error threshold may, for example, be in reference to a maximum permissible root mean square error (RMSE). A module 124, which may also be implemented as computer program instructions stored on a memory, supports selecting an optimum configuration, consistent with the allowed block sizes, that provides efficient compression within a minimum quality constraint. In one embodiment the compression controller supports choices to keep one or both of quality and compressed block size static or variable, allowing a greater degree of flexibility in compressing textures while maintaining quality.

An individual texture image has local regions with different texture characteristics. The compression controller 120 is free to determine a block size within a local region of a single texture that satisfies a quality constraint. Additionally, the compression controller is free to test and select configurations in which the texture is partitioned and compressed into different block sizes over the texture. The ability to vary the block size within the texture permits fixed rate compressor 102 to be utilized in a manner that varies the block size to provide variable rate compression over a texture.

A single texture may have local regions with different texture characteristics that determine a compression error for compressing the local region with a block of a given size. For example a texture image may vary in detail over the texture image, corresponding to variations in frequency components. In one embodiment the block size is adapted, as required in local regions of the texture, to maintain the quality constraint. Smaller block sizes may be used in regions of a texture associated with higher frequency components. For example, a smaller block size may be used in regions of a texture have greater detail and a larger block size may be used in regions of a texture having lesser detail.

The partitioning of a texture into different possible block sizes for testing may be determined in different ways, such as by testing a set of possible pre-determined configurations for M×M sized texel regions or by using a set of rules to flexibly determine a block configuration in local regions of a texture.

The compressed texture data 140 and metadata 150 is stored in a memory 160, which may be part of a memory subsystem of a graphics system or graphics processing unit. A bus or buses 170 may be used to communicatively couple different portions of the system 100. In one embodiment the metadata 150 is organized as a metadata dictionary that defines the location of a desired compressed block. The metadata 150 allows addressing and fetching a particular block of texels. Additionally, it describes the compression for the given block. The metadata 150 provides a map into compressed texture space to fetch a desired texture block. The metadata 150 may be organized in different ways. In one embodiment, the metadata 150 stores a block type and an offset, which is accessed before fetching a block of compressed texture data and decoding it. In another embodiment the metadata 150 stores the block types but no offset. In one embodiment the metadata 150 is organized into a dictionary that allows one unique copy of a compressed block to be stored to represent redundant duplicate compressed blocks. That is, the metadata 150 can have multiple entries point to the same compressed block. In one embodiment the metadata 150 is defined at the granularity of a specific block size.

The system 100 may be used to support online compression, offline compression, or a combination of online compression and offline compression, depending on implementation details. In one embodiment, the system 100 supports offline compression to compress textures. As an example, offline compression of textures may be performed of textures created during the application development process. Such textures are not expected to be modified during the execution of the application, and thus can be compressed once using an offline compressor. Also, since the compression is performed offline, prior to execution of the application, the compression does not have to be performed as fast as the decompression. In one embodiment, the online decompressor is implemented in hardware.

Figure 2:
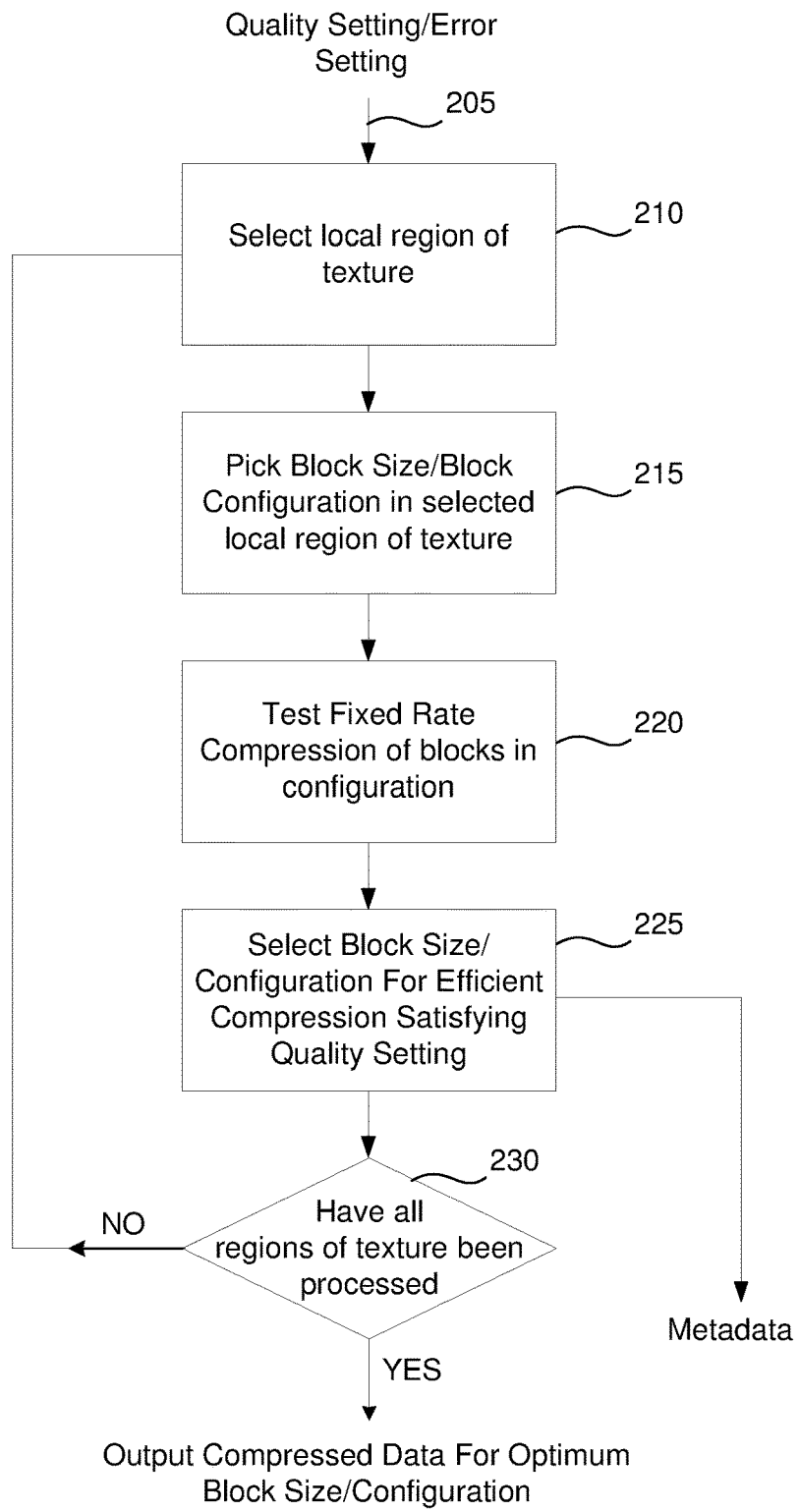
FIG. 2 illustrates a variable rate compression method in accordance with an embodiment.

FIG. 2 illustrates an embodiment in which an optimum block size/configuration for compression is determined by the compression controller 120 based on an initial quality setting or error setting. For example, the block partitioning and compression testing module 120 may perform one or more steps for the selection of block size/block configurations in local regions of a texture. A selection of an optimum compressed block configuration may be performed by compressed block configuration selection module 124. In one embodiment, a quality setting 205 is provided. The quality setting may correspond to a compression criterion, such as an error threshold for individual blocks. The error threshold may correspond to satisfying a single condition. However, more generally the error threshold may also be a compound threshold where two or more conditions have to be met, such as a relative error condition and an absolute error condition. The quality setting may be a default setting. However, more generally, the quality setting is selectable by a component of the system 100 or by a user input received by controller 120. For example, a user input can select an error threshold. Alternatively, a user input can select one of two or more quality level settings (e.g., high, medium, and low) from which an error threshold is derived. In one embodiment, a user input received by controller 120 is used to select a block size/block type for a particular image subregion. In turn, the user input of selected block sizes/block types can be translated into an error condition.

A local region of a texture is selected 210 to test different block sizes and block arrangements. The block size(s) and a configuration of blocks in the selected local region are picked 215, consistent with the set of allowed block sizes. Fixed rate compression of blocks in a given configuration is tested 220. A selection 225 is made of block sizes/block configurations over the texture that provides efficient compression while satisfying the quality setting over local regions in the texture. The corresponding metadata is output for the selected block sizes/block configurations. One aspect is that both a block size and a block configuration may be varied over local regions of the texture. For example, a footprint may include arrangements of 4×4 and 8×8 blocks within an overall footprint of a larger size (e.g., a 16×16 footprint, 32×32, or 64×64 footprint). Thus, a single configuration may include a single block size or have blocks of different sizes. In decision block 230 a determination is made whether all of the regions of the texture have been processed. If not, another local region 210 is selected until the process loops through the possible block configurations for all of the local regions of the texture and output the most efficient configuration for compression consistent with a quality setting/error setting.

Figure 3:
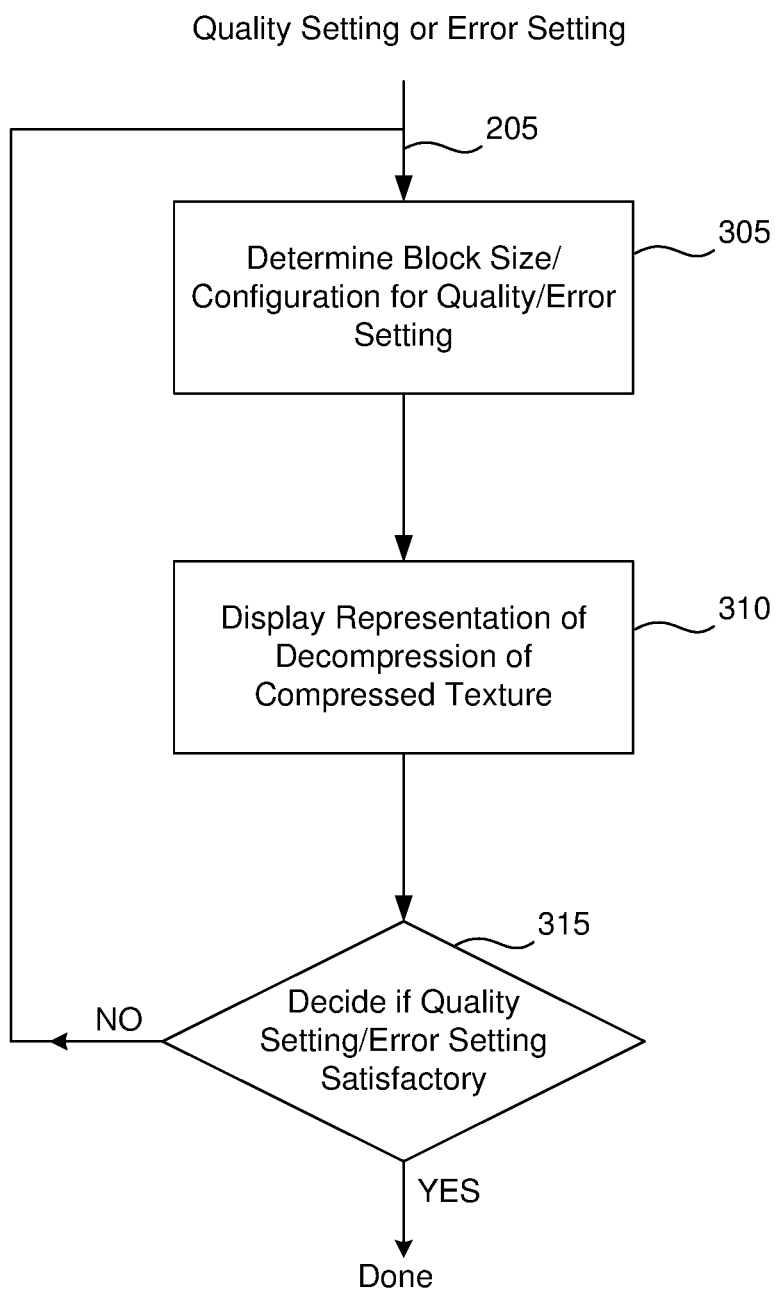
FIG. 3 illustrates a variable rate compression method with user control of a quality tradeoff in accordance with an embodiment.

FIG. 3 illustrates a variation of the method of FIG. 2 to aid in selecting a quality/compression tradeoff performed by the modules 122 and 124 of compression controller 120. In one embodiment, an initial error threshold or quality setting 205 is pre-selected. A determination is made of a block size/configuration, for the initial quality setting 305, to compress the texture image. A user interface may be generated 310 representing the quality of a decompressed version of the compressed data. As examples, this may include generating a display of how a decompressed version of the entire compressed image will appear or generating a display indicating how critical areas of the decompressed compressed texture will appear. A component of the system decides 315 whether to adjust the quality setting based on receiving a user input. If the quality is satisfactory, the process is completed. If not, a new quality setting is selected and the process loops again through blocks 305 and 310.

Figure 4:
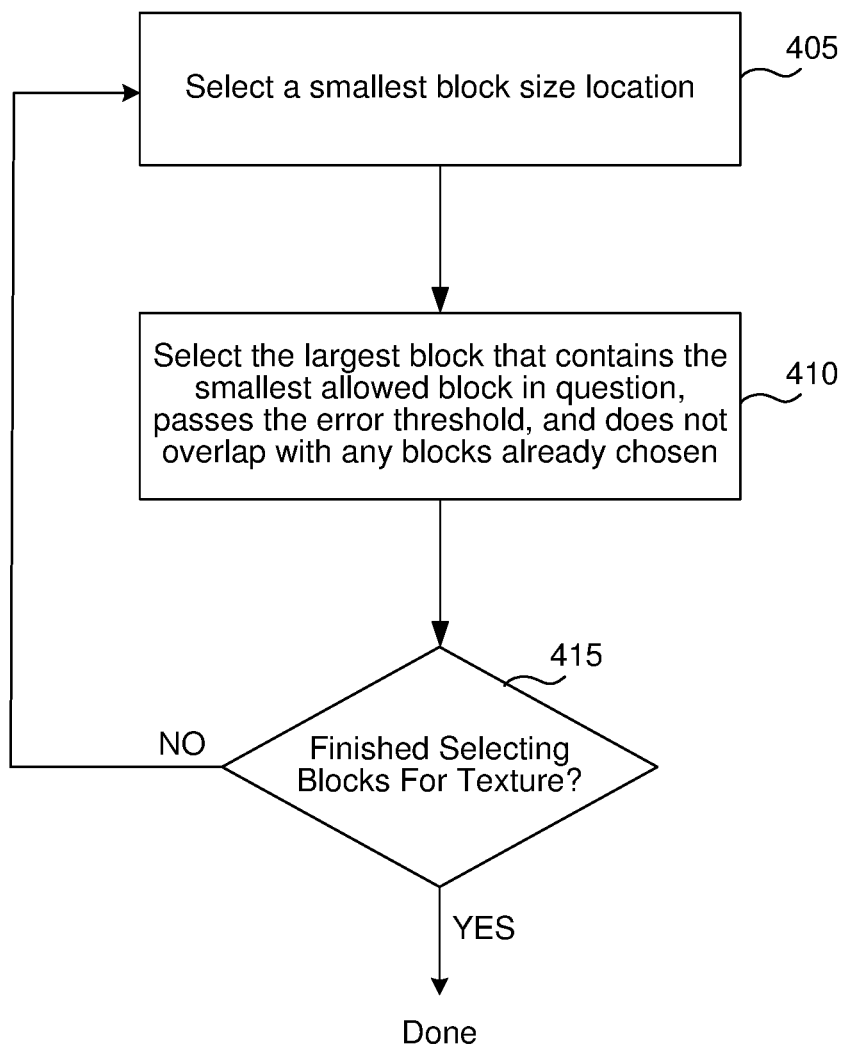
FIG. 4 illustrates a method to determine a largest allowable block size to determine an optimum configuration of block sizes in accordance with an embodiment.

FIG. 4 illustrates a method in accordance with an embodiment to determine a block configuration performed by the block configuration and compression testing module 122 of compression controller 120. In one embodiment, a set of rules is utilized to flexibly determine a configuration by starting from a smallest allowed block size and attempting to find the largest block size satisfying an error threshold. In one embodiment, for the smallest allowed block in a texture, the method includes selecting a smallest block size location of a texture 405. An attempt 410 is made at each location to find the largest block size that contains the smallest allowed block in question, passes the error threshold, and which does not overlap with any blocks already chosen. Thus, for example, suppose a location of a 4×4 block is tested. An attempt is made to find a larger block, such as a 16×16 block, that contains the 4×4 block and which satisfied the quality setting/error threshold. A determination is made whether additional blocks need to be selected for the texture in decision block 415. If the process of selecting blocks is finished, the process is done. If not, the process loops to select a new smallest block location 405. Using a simple set of rules, a configuration of block sizes and block arrangements is determined that provides efficient compression and which satisfies the quality setting/error threshold over all regions of the texture.

Figure 5:
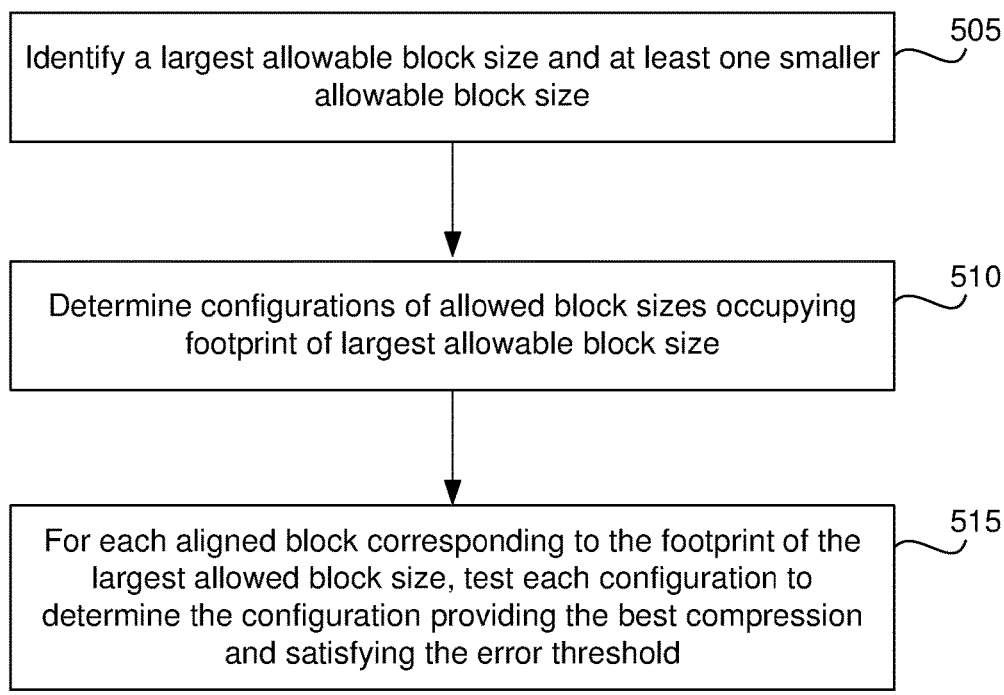
FIG. 5 illustrates a method of determining an optimum configuration of block sizes in accordance with an embodiment.

FIG. 5 illustrates a method in accordance with an embodiment to determine a block configuration by the modules 122 and 124 of compression controller 120. In one embodiment, a largest allowed block size is selected 505, as well as at least one smaller allowed block size. Different configurations of allowed blocks sizes fitting into the footprint of the largest allowed block size are determined 510. For each aligned block of pixels having the same footprint as the largest allowed block size, the different configurations are tested 515 to determine the configuration having the best compression consistent with the error threshold. For example, if a largest block size is 12×12, then in each aligned 12×12 region the possible configurations of different allowed block sizes fitting within a 12×12 region are tested.

Figure 6:
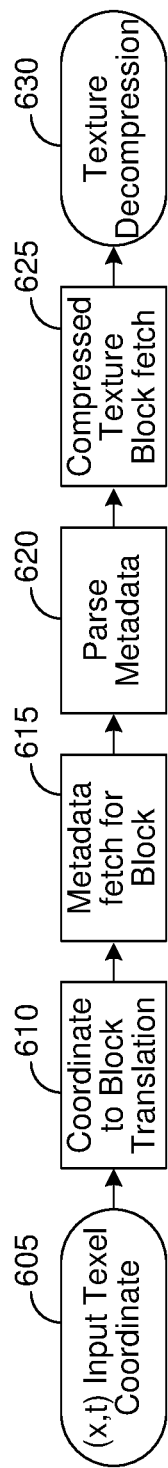
FIG. 6 illustrates a method to perform decompression in accordance with an embodiment.

FIG. 6 illustrates a method for translating a texture request into a compressed block that can be processed by a decompressor 110, in accordance with an embodiment. The method may be performed by the decompressor accessing information in the metadata/metadata dictionary 150. In one embodiment, a (u,v) texel coordinate 605 is provided for coordinate-to-block translation. A metadata fetch 615 is performed for the block. The metadata is parsed 620 and used to provide a map into the compressed texture space to perform a compressed texture block fetch 625 of the compressed texture data, which is then used to perform texture decompression.

The metadata may be defined at different levels of block granularity, depending on implementation details. The metadata identifies block size and other details for each block. While different block sizes are allowed, in one embodiment the metadata is defined at the granularity of a selected block size. As examples, the metadata may be defined at either the finest level of granularity or at the coarsest levels of granularity. For example, if the finest granularity is a 4×4 block, the metadata may be defined at the level of 4×4 blocks. Alternatively, if the coarsest level of a granularity is at a 12×12 block size, the metadata may be defined at the 12×12 block level.

Embodiments of the present invention may be used with fixed rate compression schemes having two or more different block sizes. In one embodiment, the variable rate compression utilizes fixed block sizes compatible with the block footprints of the ASTC.

As an illustrative example of metadata at a fine level of granularity, consider an example having a minimum allowed block size of 4×4 blocks and supported block sizes of 4×4, 8×8, and 12×12 blocks. In one embodiment, the allowed block sizes are compatible with ASTC.

In this example, each 4×4 block may belong to one of the following 15 configurations:

a/flat/constant block in which all of the pixels with the block have the same value;
one 4×4 block,
one of 4 sub-blocks of an 8×8 block;
one of 9 sub-blocks of a 12×12 block The 15 configurations can be expressed using a 4-bit code, augmented with a 20 bit block offset to maintain byte aligned data. This results in a metadata entry 3 bytes long corresponding to a 4×4 block. In one embodiment, two of the 4-bit code values indicate flat blocks, the first bit indicating storage in the first half of a 16 byte compressed block, the second indicating the later half. The compressor can utilize this data layout to make similar blocks point to the same memory locations, improving the hit rate of a caching mechanism for texture data.

In one embodiment, for each aligned 4×4 block in a static texture, a row exists in a metadata table of the metadata dictionary with the following entries:
1) 4-bits denoting the block type, where the block types include:
a) a flat/Uniform block. A flat/uniform block is a block in which all pixels within the block have the same color;
b) A 4×4 ASTC block;
c) One of 4 sub-blocks of an 8×8 ASTC block; and
d) One of 9 sub-blocks of a 12×12 ASTC block;
2) 20 bits denoting a block offset, in which:
a) ASTC blocks are always 16-bytes wide; and
b) Flat blocks: 20-bits denote color value instead of offset, if size of(texel)<=20 bits An alternate embodiment of the metadata includes a 32-bit block offset to allow the storage of 8-bit, 4-channel color values in the metadata itself, leading to a metadata size of 36 bits per 4×4 block.

In one embodiment, a compression process begins with an error threshold epsilon. In principle, a default error threshold epsilon may be used. In one embodiment the error threshold epsilon is a user-input selection of an error threshold epsilon, which defines a maximum permitted Root-Mean-Squared-Error (RMSE). This error threshold may be directed selected as a user input or indirectly selected, such as by selecting different general quality levels.

In one embodiment, a compression code uses a reference ASTC block compression codec, to which 4×4, 8×8, or 12×12 sized blocks of pixels can be provided, returning an optimal ASTC compressed block of that size. In one embodiment, each block is compressed according to the ASTC compression code, the RMSE value is determined for the compressed data as compared to the original pixel data, and a Boolean value is returned indicating whether the specified block size and compressed data are within the specified error threshold.

The compression process can be posed as a constrained optimization problem to minimize compressed texture size while satisfying the error threshold for each individual block. Since such an optimization is NP-complete (where the abbreviation NP refers to "nondeterministic polynomial time") in practice. However, it will be understand that many variations of the compression process are possible.

In one embodiment an ASTC compatible process includes performing, for each allowed block size, subdividing the texture into blocks of that size, and compressing each block using the ASTC codec. For example, for block sizes 4×4, 8×8, and 12×12, partitions in local regions are created of the texture into:

aligned 4×4 blocks (1 possible);
8×8 blocks (4 possible); and
12×12 blocks (9 possible)

Figure 7:
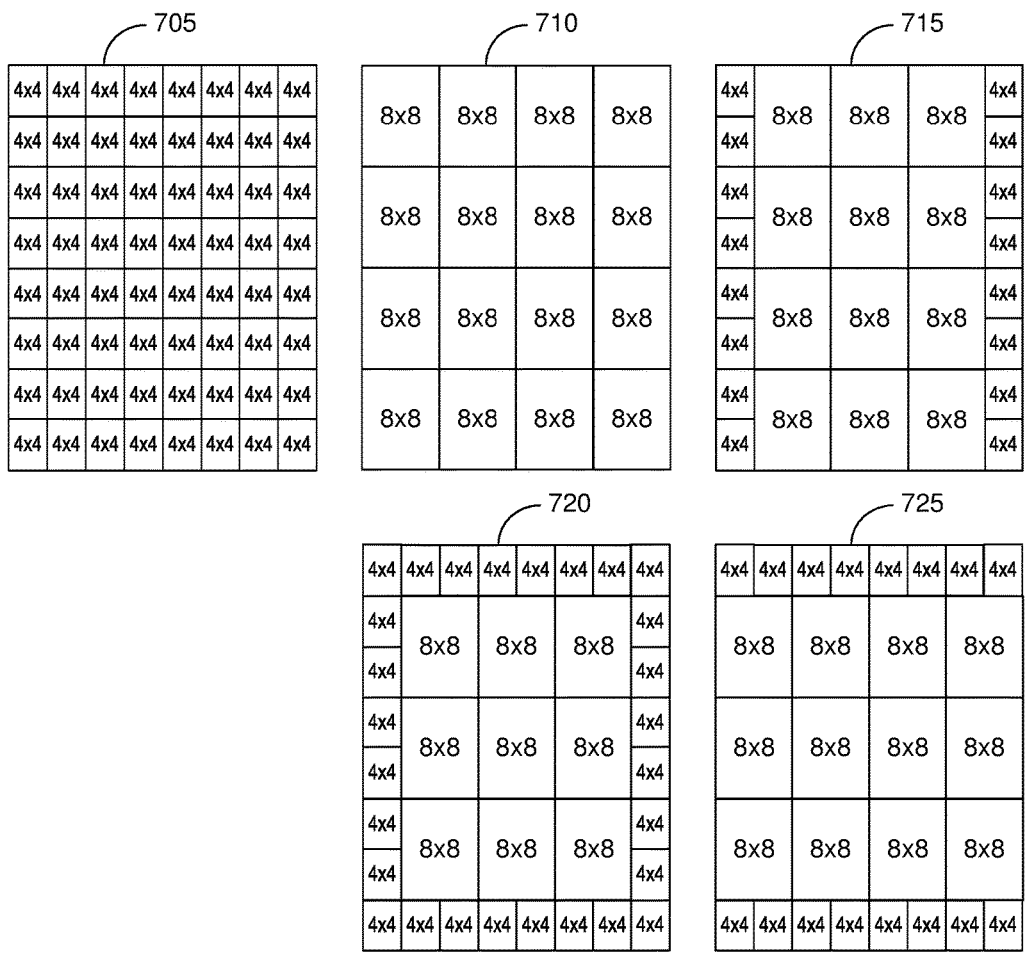
FIG. 7 illustrates an example of several possible block subdivisions in a local region of an image texture in accordance with an embodiment.

FIG. 7 illustrates several of the possible block subdivisions with 4×4 and 8×8 blocks (with the 12×12 configurations not shown for simplicity). FIG. 705 illustrates a selection in which a local region has 4×4 blocks. FIG. 710 illustrates a selection in which a logical region has 8×8 blocks. FIGS. 715, 720, and 725 illustrate examples in which a local region has a combination of 4×4 and 8×8 blocks.

Figure 8:
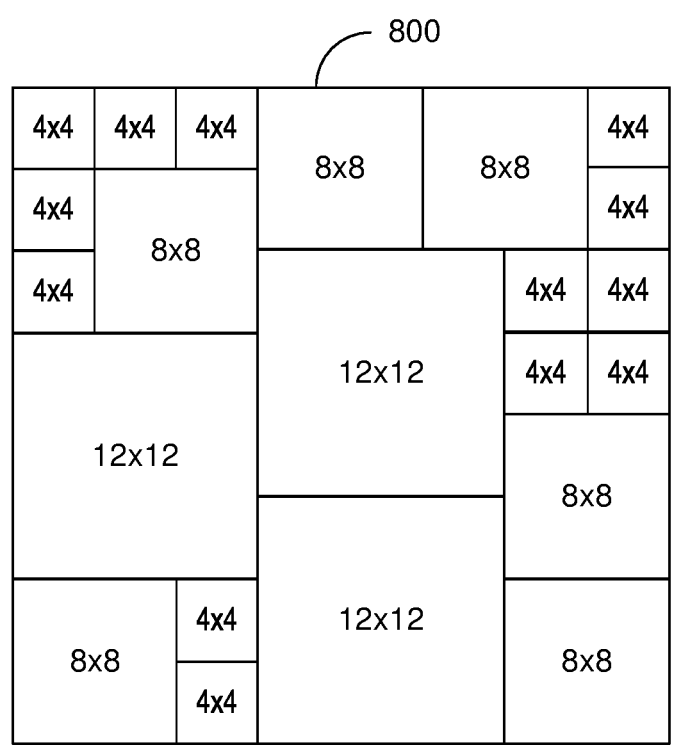
FIG. 8 illustrates an example of block selection in a local region in accordance with an embodiment.

In one embodiment, a set of rules is used to determine block size based on "greedily" starting from a location of a smallest block size and attempting to find a larger block size consistent with the error threshold and previous choices. In one embodiment, for each 4×4 block in the texture, an attempt is made to greedily find 12×12, 8×8 blocks (in that order) which:

contain the 4×4 in question;
pass the error threshold; and
do not overlap with any blocks already chosen FIG. 8 illustrates an example of possible block choices chosen for a texture in which the block size is determined by greedily attempting to find the largest block size that contains a given 4×4 in question, passes the error threshold, and does not overlap with previously chosen blocks. In the example of FIG. 8 the process has the freedom to partition the texture in a highly fragmented fashion. In this example, 4×4, 8×8, and 12×12 blocks are selected in a local region.

In addition, in one embodiment to prevent redundancy in compressed blocks, each compressed written into the compressed texture is also inserted into a redundancy-removal structure to ensure that blocks which have the same compressed representation are not stored multiple times. Any recurrence of blocks is avoided by making the block offset point to the last written copy of the block data. Multiple redundancy removal structures are possible, including hash maps, and VP Trees (See, e.g., "Data structures and algorithms for nearest neighbor search in general metric spaces" by Peter Yianilos, Proceedings of the fourth annual ACM-SIAM Symposium on Discrete algorithms, 1993, pages 311-321. Given a set of points in a high-dimensional space, and a distance metric defining the separation between two such points, this reference proposes an efficient method to find the nearest neighbor within this set for a query point. In our case, a high-dimensional point is the block of texels, with the distance metric being the difference in pixel values, represented using a distance metric like the Euclidean distance for example. The query checks if the nearest neighbor is at a distance 0 from the query point which indicates a redundant block. If the distance is greater than 0, then the query point should be added to the set.

Figure 9:
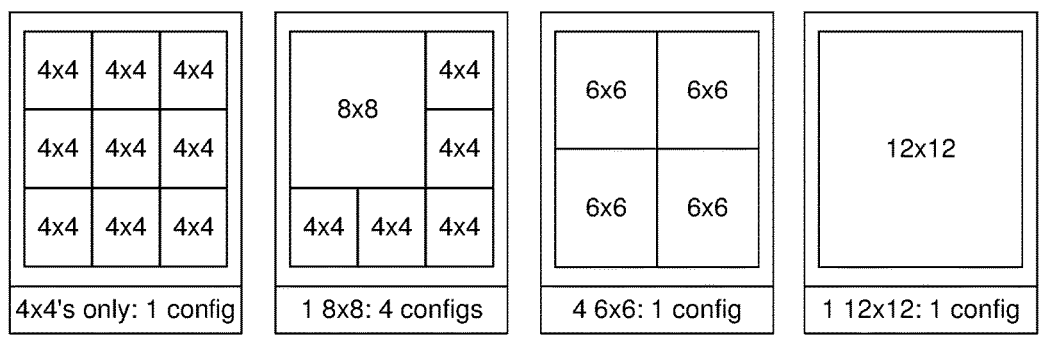
FIG. 9 illustrates an example of several different block configurations in accordance with an embodiment.

In an alternate embodiment, metadata is maintained at a lower level of granularity, such as one row per 12×12 block. This lowers the amount of metadata per pixel, but also restricts the configurations of blocks during compression. As a result, the compression algorithm may test fewer configurations, which are the illustrated in FIG. 9. For a 12×12 footprint there are seven possible configurations if the allowed block sizes are 4×4, 6×6, 8×8, and 12×12, as illustrated in FIG. 9. This includes one configuration with only 4×4 blocks, four configurations having a combination of one 8×8 block and four 4×4 blocks, one configuration with four 6×6 blocks, and one configuration with one 12×12 block.

Figure 10:
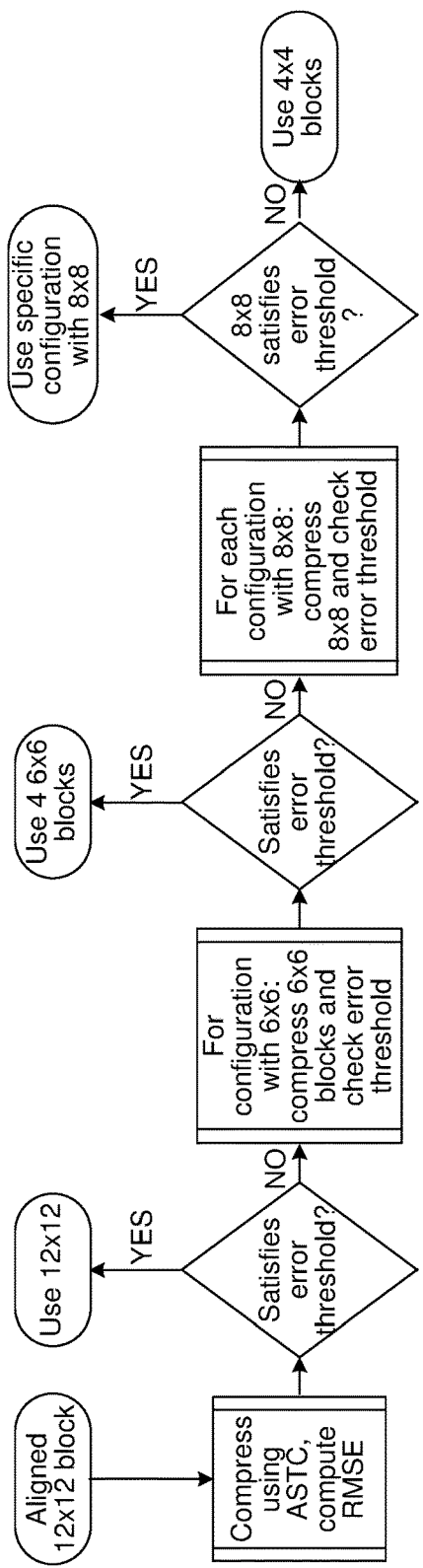
FIG. 10 illustrates a compression process in accordance with an embodiment

In this case, metadata consists of:
3-bit block type, identifying one of the 7 possible configurations; and
21-bit block offset FIG. 10 illustrates an embodiment of a compression flow sequence performed by the compression controller 120. An aligned block of pixels corresponding to a 12×12 size is accessed. It is compressed and an error test is performed. If compression as a single 12×12 block satisfies the error threshold, then the 12×12 configuration is used. If, not, a configuration with 6×6 blocks is compressed. If the error test is satisfied, the 6×6 block configuration is used. If not, each configuration of 8×8 blocks is compressed and tested. If one of the 8×8 configurations satisfies the error threshold, it is selected. If, not 4×4 blocks are used.

Figure 11:
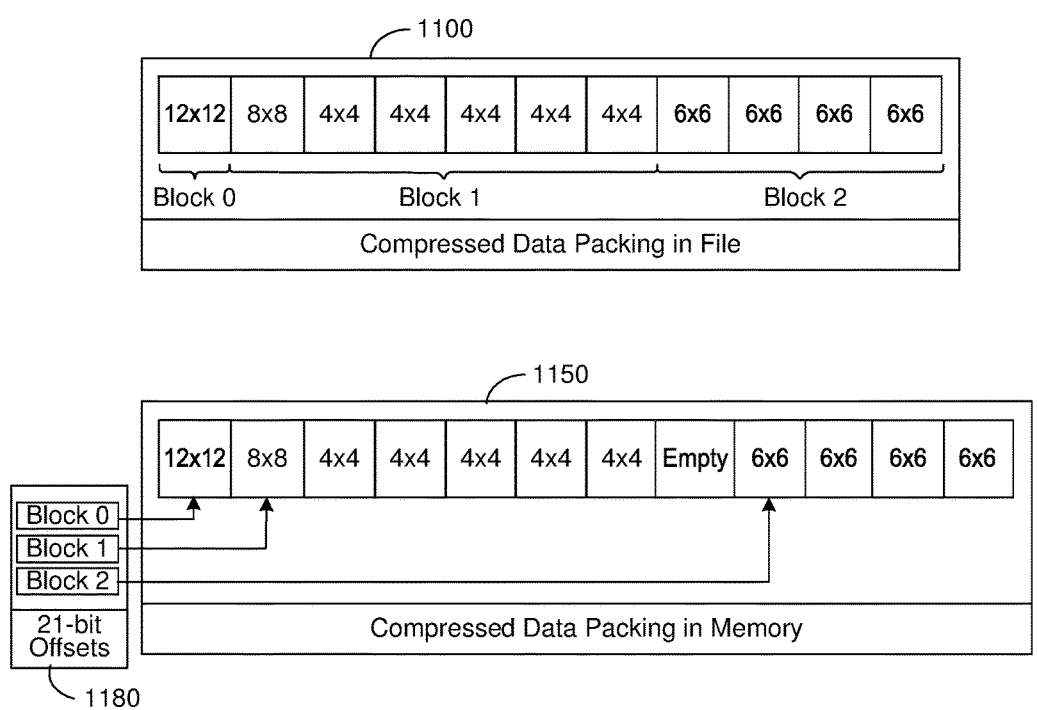
FIG. 11 illustrates an example of how compressed data packing in memory and disc need not match and how higher compression can be achieved on disc in accordance with an embodiment.

FIG. 11 illustrates data packing in a memory and disc need not necessarily match and how higher compression can be achieved in accordance with an embodiment. In one embodiment, metadata overhead is reduced in compressed data that is stored on disc. When writing the compressed texture to a file 1100, packing is performed in the data section where each adjacent set 12×12 blocks have compressed data stored adjacent in the compressed file. This implies that a 3-bit block type is used to determine the size of data for each compressed 12×12, and only this metadata needs to be stored in the file header. This restricts the texture usage to a serial in-order traversal. In one embodiment, a metadata decompressor 1180, in software or hardware, is configured to stream 12×12 blocks from the file into memory 1150 and unpack the storage appropriately while ensuring cache-line granularity. During this operation, the decompressor 1180 would also generate the 21-bit block offset depending on the placement of the compressed block in the memory address space.

While the invention has been described in conjunction with specific embodiments, it will be understood that it is not intended to limit the invention to the described embodiments. On the contrary, it is intended to cover alternatives, modifications, and equivalents as may be included within the spirit and scope of the invention as defined by the appended claims. The present invention may be practiced without some or all of these specific details. In addition, well known features may not have been described in detail to avoid unnecessarily obscuring the invention. In accordance with the present invention, the components, process steps, and/or data structures may be implemented using various types of operating systems, programming languages, computing platforms, computer programs, and/or computing devices. In addition, those of ordinary skill in the art will recognize that devices such as hardwired devices, field programmable gate arrays (FPGAs), application specific integrated circuits (ASICs), or the like, may also be used without departing from the scope and spirit of the inventive concepts disclosed herein. The present invention may also be tangibly embodied as a set of computer instructions stored on a computer readable medium, such as a memory device.

What is claimed is:

1. A system for data compression, comprising:
a memory storing instructions and a processor configured to execute the instructions to:
access a texture image for compression;
test various block configurations in a local region of the texture image to determine if all blocks in each block configuration of the various block configurations satisfy a compression criterion, wherein the various block configurations comprise blocks of more than one block size;
automatically select a block configuration of the various block configurations that satisfies the compression criterion; and
compress the texture image using the selected block configuration using a fixed rate compressor, wherein the fixed rate compressor is configured to compress each of the block sizes to a fixed number of bits; and
wherein the compression criterion comprises a quality setting and/or error threshold.

2. The system for data compression of claim 1, wherein the instructions comprise instructions to vary an effective compression rate over the texture image by varying the block sizes over the texture image.

3. The system for data compression of claim 2, wherein the instructions comprise instructions to automatically adjust the block sizes based on local characteristics of the texture image to satisfy the compression criterion, which comprises at least a minimum compression quality for each of the blocks.

4. The system for data compression of claim 1, wherein the instructions comprise instructions to automatically determine a partitioning of the texture image into the blocks based on the compression criterion, which corresponds to a combination of compression efficiency and compression quality.

5. The system for data compression of claim 1, wherein the instructions comprise instructions to independently select the block sizes over the texture image based on constraints of minimizing a compressed texture size and satisfying the compression criterion comprising an error threshold for each of the blocks indicative of a minimum compression quality.

6. The system for data compression of claim 5, further comprising receiving a user input and wherein the error threshold is determined by the received user input.

7. The system for data compression of claim 1, wherein for redundant blocks, metadata indexes each instance of redundant blocks to one unique copy of each unique compressed block to be stored.

8. The system for data compression of claim 1, wherein at least two of the block sizes are selected from a group consisting of 4×4 blocks, 6×6 blocks, 8×8 blocks, and 12×12 blocks.

9. The system for data compression of claim 1, wherein the instructions comprise instructions to partition the texture image in local regions into any one of a set of at least two different block size configurations.

10. The system for data compression of claim 1, wherein the instructions comprise at least one rule to determine a portioning of the texture image into blocks of different block sizes.

11. A method of compressing texture data, comprising:
accessing, by one or more processors, a texture image,
testing various block configurations in a local region of the texture image to determine if all blocks in each block configuration of the various block configurations satisfy a compression criterion, wherein the various block configurations comprise blocks of more than one block size and the compression criterion comprises at least a minimum compression quality threshold;
automatically selecting a block configuration of the various block configurations that satisfies the compression criterion; and
compressing the texture image with the selected block configuration using a fixed rate compressor, wherein the fixed rate compressor is configured to compress each of the block sizes to a fixed number of bits; and
wherein the compression criterion comprises a quality setting and/or error threshold.

12. The method of claim 11, wherein at least two different block sizes are selected from a group consisting of 4×4 blocks, 6×6 blocks, 8×8 blocks, and 12×12 blocks.

13. A method of compressing a texture using a fixed rate compressor comprising:
accessing, by one or more processors, a texture image for compression;
testing various block configurations in a local region of the texture image to determine if all blocks in each block configuration of the various block configurations satisfy a compression criterion, wherein the compression criterion comprises a quality setting and/or error threshold and wherein the various block configurations comprise blocks of more than one block size;
automatically selecting a block configuration of the various block configurations that satisfies the compression criterion;
compressing the texture image using the fixed rate compressor, wherein the fixed rate compressor is configured to compress each of the block sizes to a fixed number of bits, and
wherein variation of the block sizes over the texture image is selected to at least vary an effective compression rate over the texture image.

14. The method of claim 13, wherein the compression criterion comprises a minimum compression quality for each block of the texture image.

15. The method of claim 13, wherein the variation of the block sizes is further selected to achieve a minimum compression ratio for each block of the texture image.

16. The method of claim 13, wherein the variation of the block sizes is further selected to minimize a compressed size of the texture image and the compression criterion comprises at least a minimum compression quality for each block of the texture image.

17. A method of using texture images, comprising:
performing, by one or more processors, compression of a texture image using a fixed rate compressor to perform variable rate compression, wherein the step of performing compression comprises:
testing various block configurations in a local region of the texture image to determine if all blocks in each block configuration of the various block configurations satisfy a compression criterion, wherein the compression criterion comprises a quality setting and/or error threshold and wherein the various block configurations comprise blocks of more than one block size;
automatically selecting a block configuration of the various block configurations that satisfies the compression criterion; and compressing the texture image using the selected block configuration using the fixed rate compressor, wherein the fixed rate compressor is configured to compress each of the block sizes to a fixed number of bits;

storing compressed block data of the texture image with metadata to identify a block size of each compressed block and provide information to access the compressed block data; and during runtime of a graphics application, utilizing the metadata to fetch and decompress compressed blocks of the texture image.

18. The method of claim 17, wherein the compression criterion comprises a minimum quality threshold per each block.

19. The method of claim 17, wherein the step of performing compression further comprises:

testing various block configurations in another local region of the texture image to determine if all blocks in each block configuration of the various block configurations satisfy the compression criterion, wherein the various block configurations comprise blocks of more than one block size;

selecting a block configuration of the various block configurations that satisfies the compression criterion in the other local region; and compressing the texture image using the selected block configuration in the other local region using the fixed rate compressor.

20. The method of claim 17, wherein said compression is performed offline.

* * * * *